United States Patent [19]
Anderson

[11] Patent Number: 5,543,756
[45] Date of Patent: Aug. 6, 1996

[54] COMBINED CRYSTAL AND LC FILTER

[75] Inventor: Thomas H. Anderson, Rohnert Park, Calif.

[73] Assignee: Hewlett-Packard Company, Palo Alto, Calif.

[21] Appl. No.: 442,715

[22] Filed: May 12, 1995

[51] Int. Cl.$^6$ ............................................. H03H 9/00
[52] U.S. Cl. ...................... 333/186; 333/175; 333/188; 330/306
[58] Field of Search ..................... 333/186–192, 333/167, 175, 178; 330/302, 306

[56] References Cited

U.S. PATENT DOCUMENTS

| | | | |
|---|---|---|---|
| 3,633,134 | 1/1972 | Barrows et al. | 333/192 |
| 3,727,154 | 4/1973 | Dailing et al. | |
| 4,489,264 | 1/1991 | Ohto | 333/178 |
| 4,568,886 | 2/1986 | English | 330/306 |
| 4,600,903 | 7/1986 | Temer | 333/186 |
| 5,072,200 | 12/1991 | Ranky | 333/175 |
| 5,162,759 | 11/1992 | Yajima | 333/188 |
| 5,229,735 | 7/1993 | Quan | 333/189 |
| 5,319,327 | 6/1994 | Konig | 333/188 |

Primary Examiner—Benny Lee
Assistant Examiner—Darius Gambino
Attorney, Agent, or Firm—Pamela Lau Kee

[57] ABSTRACT

A circuit for an intermediate frequency filter combines a variable bandwidth series resonant filter circuit and a parallel resonant filter circuit. A variable output impedance drives the filter and a variable input impedance amplifier buffers the output of the filter. The output impedance of the driver is made to track the input impedance of the output buffer. Changes in the gain of the filter with respect to bandwidth are relatively small. The noise figure of the filter remains low. The circuit is not operated in the non-linear region of the crystal because relatively low drive currents are needed at narrow bandwidths so that the crystal is not overdriven. The LC filter tunes out the stray capacitance from the load of the crystal filter.

13 Claims, 6 Drawing Sheets

COMBINED CRYSTAL AND LC FILTER

FIELD OF THE INVNETION

The present invention relates to bandwidth filters and, more specifically to combining a variable bandwidth series resonant filter circuit and a parallel resonant filter circuit. The invention illustrates a variable intermediate frequency filter having a high degree of circuit integration to reduce manufacturing costs while maintaining precision frequency selectivity.

BACKGROUND OF THE INVENTION

Spectrum analyzers use intermediate frequency (IF) bandpass filters to resolve signals of different frequencies. These filters have variable bandwidths. Two types of analog electronic filters are commonly used in combination to build these IF filters: crystal and LC. The crystal filters provide a range of bandwidths that are narrower than the bandwidths provided by the LC filters.

In spectrum analyzer IF filters, the crystal filters are used in series resonant mode, while the LC filters are used in parallel resonant mode. Parallel resonance provides anti-resonance, a condition of maximum impedance at a range of basic frequencies. Series resonance provides resonance, a condition of low impedance at a range of frequencies. The basic topology used in the prior art for LC filters is shown in FIG. 1 and the basic topology used in the prior art for crystal filters is illustrated in FIG. 2. In both topologies, the variable resistors determine the bandwidth of the filters but also varies the passband gain of the filter.

Crystal filters have several drawbacks. One major problem is that the high input impedance amplifier, such as a FET-input buffer amplifier, which buffers the output of the crystal filter, has a relatively high input noise voltage. The high input noise voltage causes the noise figure of the filter to be higher than desirable. Another problem is that the narrowest bandwidth setting requires more drive current than the wider bandwidths because the input resistance of the IF filter is lowest in the narrowest bandwidth. The widest bandwidth setting has the highest resistance and the resulting noise voltage of the variable resistor can aggravate the noise figure further. A third problem is that crystals have nonlinear properties which can cause shifts in crystal resistance and frequency at high levels of current. These shifts cause the gain to change with signal level and decrease the amplitude accuracy of the filter. Furthermore, crystals manufactured to minimize these shifts are expensive.

LC filters also have limitations. In contrast to the crystal filters, the narrowest bandwidth setting has the highest impedance, the resulting noise voltage may aggravate the noise figure. Secondly, the widest bandwidth setting requires more drive current because the input resistance is low. In order to avoid excessive losses in IF filters, low loss (high-Q) crystals and inductors are used. High-Q crystals and inductors are very expensive to build. There is a conflict between the need to not have gain variations caused by losses and the desire to use lower-Q, less expensive parts. The filter losses due to Q change as the bandwidth of the filters is changed. Precision filtering applications require that the effect of these gain variations with respect to bandwidth be removed.

Prior art addressed these gain variations in crystal filters in several ways. One method to resolve this design conflict is to allow the loss of the filter to vary and change the gain of a preamplifier or post-amplifier to cancel the loss of the crystal filter. Another prior art solution uses a negative output impedance buffer amplifier to cancel the crystal motional resistance. FIG. 3 shows a third prior art solution, disclosed by Viaden Temer in U.S. Pat. No. 4,600,903, in which a feed forward transformer compensates for the loss in the voltage divider from by the crystal motional resistance and the resistors R2 and R3.

These prior art solutions do not provide constant gain throughout the bandwidth range while still providing a low noise figure. Nor do these prior art solutions share common amplifiers, variable resistors, or inductors among the crystal and LC filters. An intermediate frequency bandpass filter having nearly constant gain with fewer components, including inductors, crystals, variable resistors, and amplifiers, is desirable.

SUMMARY OF THE INVENTION

The intermediate frequency bandpass filter uses LC and crystal filters in an integrated topology. The intermediate frequency filter combines a variable bandwidth parallel resonant circuit and a series resonant circuit. A variable output impedance drives the IF filter and a variable input impedance amplifier buffers the output of the IF filter. The output impedance of the driver is made to track the input impedance of the output buffer. Varying these tracking impedances varies the bandwidth of the filter. Intentional incorporation of small mismatches in the tracking impedances help to minimize gain versus bandwidth variations caused by the loss of the filter components. A switching network selects either LC mode or crystal mode of operation.

Changes in the gain of the IF filter with respect to bandwidth are relatively small. The noise figure of the IF filter remains low. The circuit is not operated in the non-linear region of the crystal because relatively low drive currents are needed at narrow bandwidths so that the crystal is not overdriven. The LC filter provides the filtering function and in addition can be used to tune out the stray capacitance of the crystal.

DETAILED DESCRIPTION OF THE PREFERRED EMBODIMENTS

Figure 1:
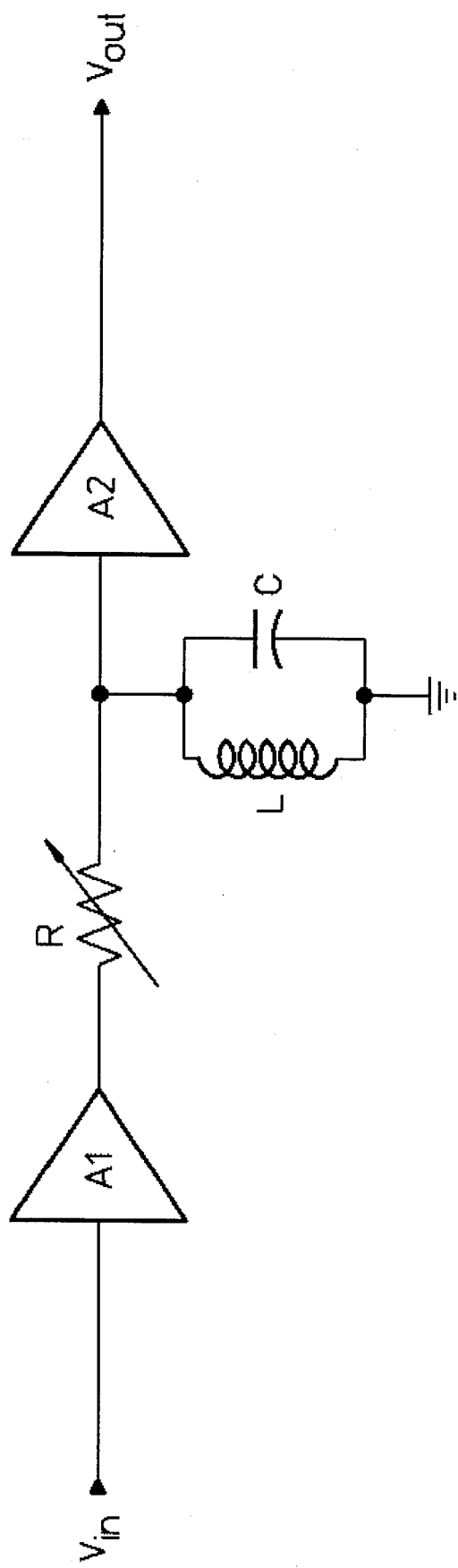
FIG. 1 illustrates a circuit topology for a prior art IF filter.
Figure 2:
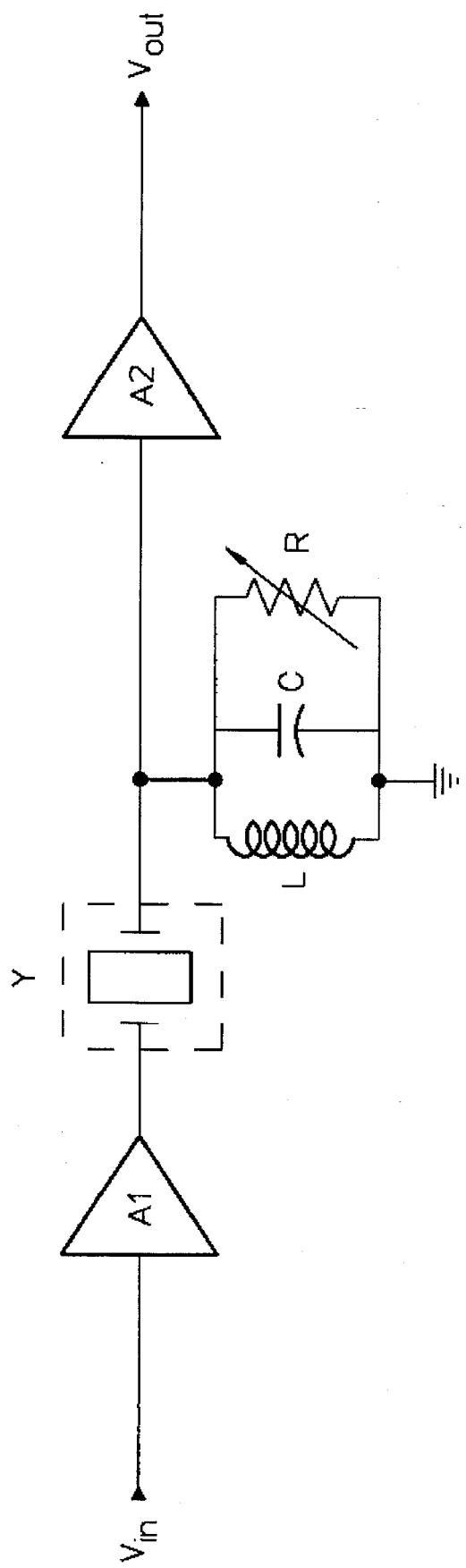
FIG. 2 illustrates another circuit topology for a prior art IF filter.
Figure 3:
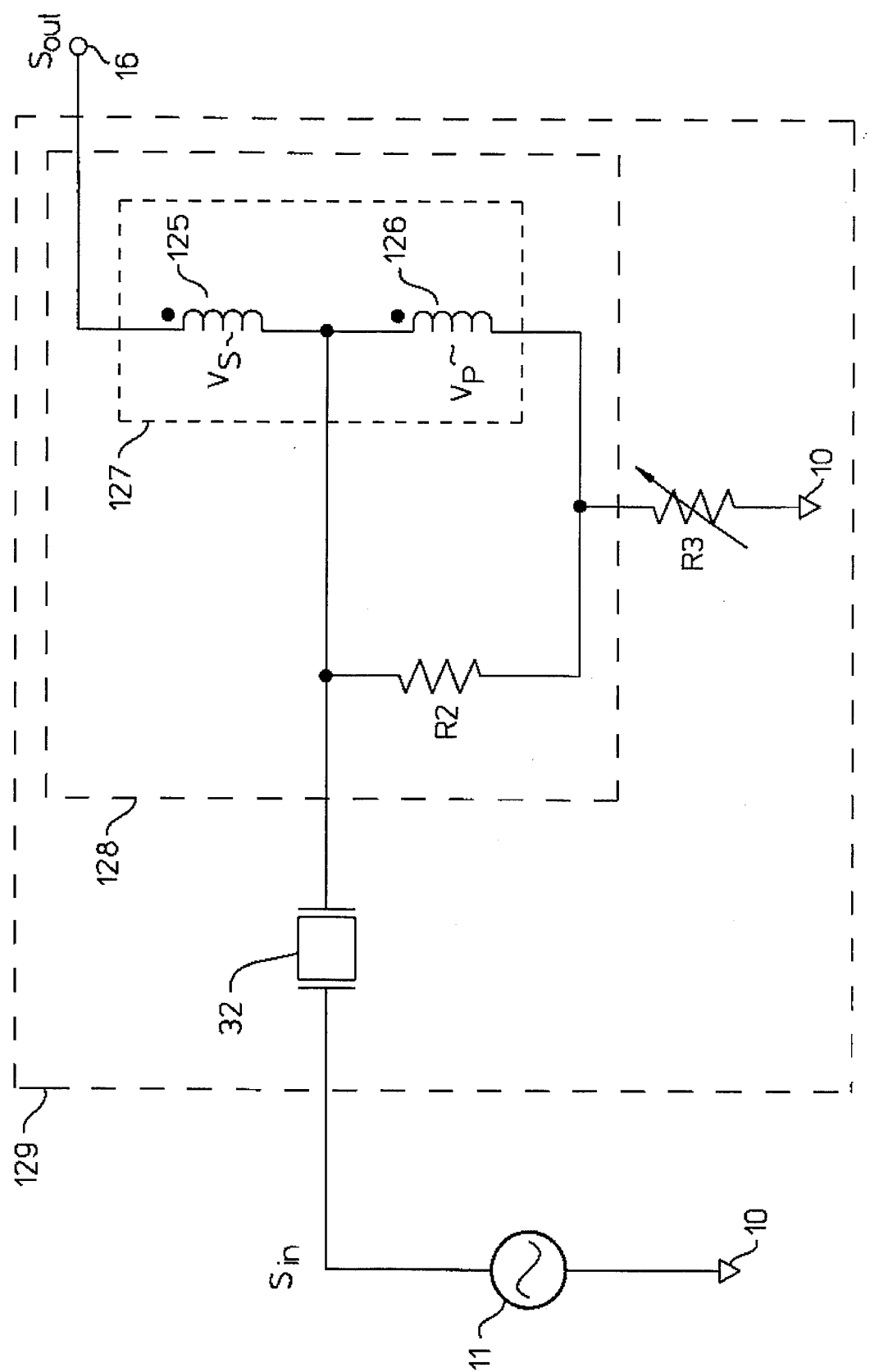
FIG. 3 shows a third prior art solution as disclosed by Viaden Temer in U.S. Pat. No. 4,600,903.
Figure 4:
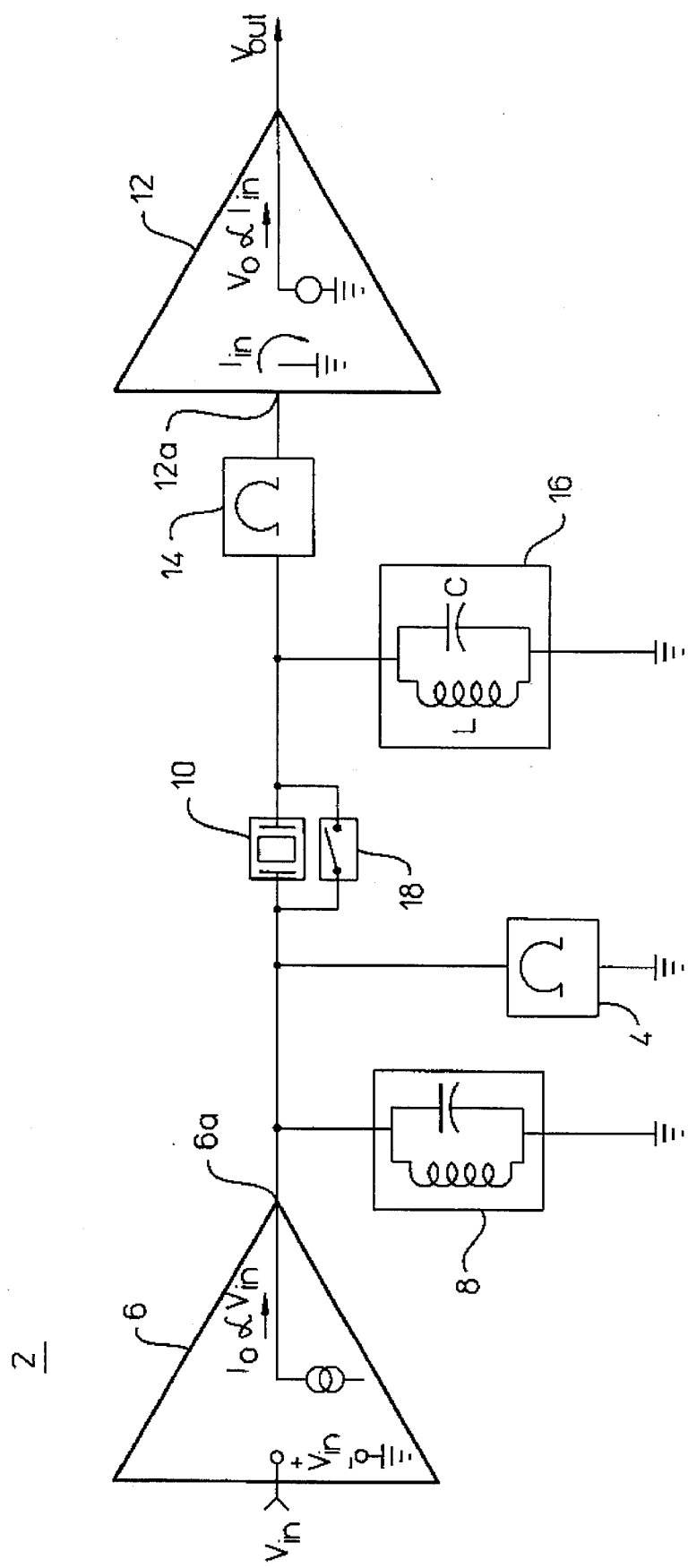
FIG. 4 illustrates a functional block diagram for an intermediate frequency bandpass filter.

FIG. 4 illustrates a functional block diagram of an intermediate frequency bandpass (IF) filter 2. A first resistive network 4 is connected between a high output impedance amplifier 6 at a high impedance output 6a and ground. A first parallel resonator 8, such as an LC tank circuit, is connected in parallel across the first resistive network 4. A series resonator 10 is connected to the high impedance output 6a at one end and a second resistive network 14 at the opposing end. The second resistive network is further connected to a low input impedance amplifier 12 at a low impedance input 12a. A switch network 18 is connected in parallel with the series resonator 10. An optional second parallel resonator 16 may be connected between the opposing end of the series resonator 10 and ground.

The high output impedance amplifier 6 has a current output that is independent of load conditions and frequency. When the first and the second resistive networks 4, 14 track one another and the input signal is at resonant frequency (a frequency equal to the center of the passband), changing the impedance of the resistive networks varies the bandwidth of the IF filter 2 without varying the current output. As a result, changes in the gain of the IF filter 2 with respect to bandwidth are relatively small. This is particularly true for the narrowest bandwidth settings. The IF filter 2 has relatively constant gain throughout the bandwidth range. This keeps the IF filter 2 operating within the linear (low drive) region of the series resonator 10, while still providing a low noise figure.

When the first and second resistive networks 4, 14 are of equal impedance (at resonant frequency), the IF filter 2 behaves as a current divider. The current gain from node 6a to node 12a is always half, because half of the input current goes through the first resistive network 4 and while the other half goes through the second resistive network 14 at resonant frequency. The 3dB bandwidth of the IF filter is modified by changing the impedances of the first and second resistive networks 4, 14.

When the switching network 18 is closed, the bandwidth decreases as the impedances 4, 14 increase. In this position, the parallel resonators 8, 16, alone or in combination, provide filtering. When the switching network 18 is open, the bandwidth increases as the impedances 4, 14 increase.

The inductance associated with a series resonator 10, when provided by a crystal, is much higher than that associated with a parallel resonator 8, and therefore can have a much narrower bandwidth. For the case of the combined crystal and LC filter, series resonators have narrower bandpass filter bandwidths than parallel resonators. Switching between the series resonator 10 and the parallel resonator 8 provides a very wide range of bandwidth settings. The switching network 18 may be comprised of relays, toggle switches, switching diodes, PIN diodes, integrated circuits, or other switch types. The variable resistance function of the first and second resistive networks 4, 14 can be performed by a PIN diode, photoresistor, potentiometer, or and integrated circuit that digitally controls resistance, such as AD8402 offered by Analog Devices.

Figure 5:
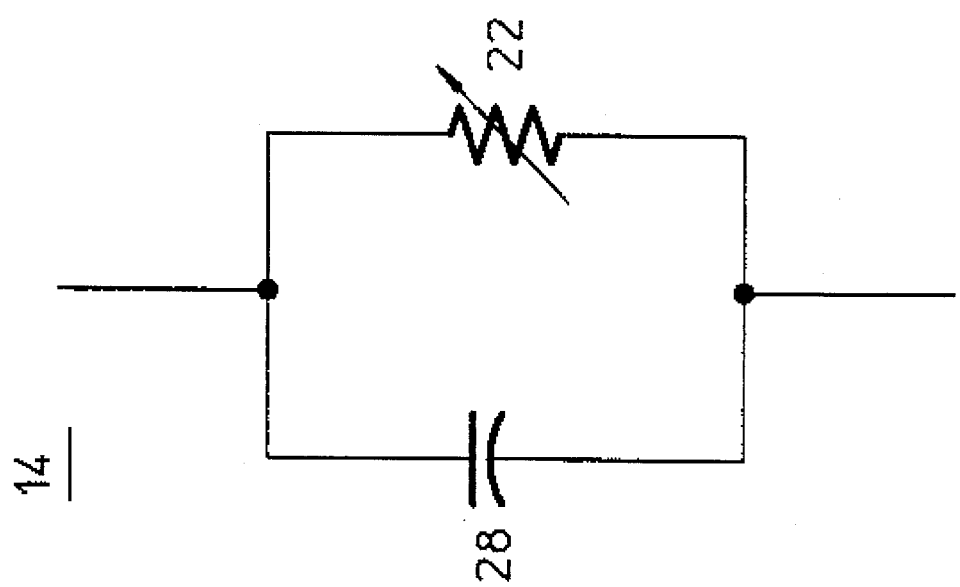
FIG. 5 is an alternate embodiment for the second resistive network shown in FIG. 4.

FIG. 5 is an alternate embodiment for the second resistive network 14 shown in FIG. 4. A capacitor 28 is connected in parallel with the second variable resistive device 22.

When $R_L$ (the resistance of the second resistive network 14) is large, a larger proportion of current in the ideal output current $I_0$ (the current through $R_L$ at the resonant frequency) is lost through the first and the second parallel resonators 8, 10. The capacitor 28 causes a boost in current going to the low input impedance amplifier 12 for large values of $R_L$ to compensate for this current loss.

Figure 6:
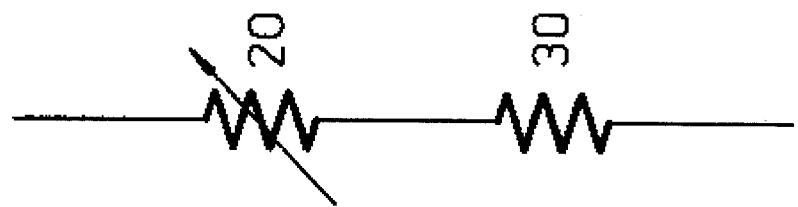
FIG. 6 is an alternate embodiment for the first resistive network 4 shown in FIG. 4.

FIG. 6 is an alternate embodiment for the first resistive network 4 shown in FIG. 4. A resistor 30 may be positioned in series with the first variable resistive device 20.

To improve the tracking of the first and the second resistive networks in the wide LC bandwidths and the narrow crystal bandwidths, the resistor 30 is added to so that the impedance of the first resistive network 4 will better match the series resistance of the second resistive network 14 and the internal resistance of the low input impedance amplifier 12.

Figure 7:
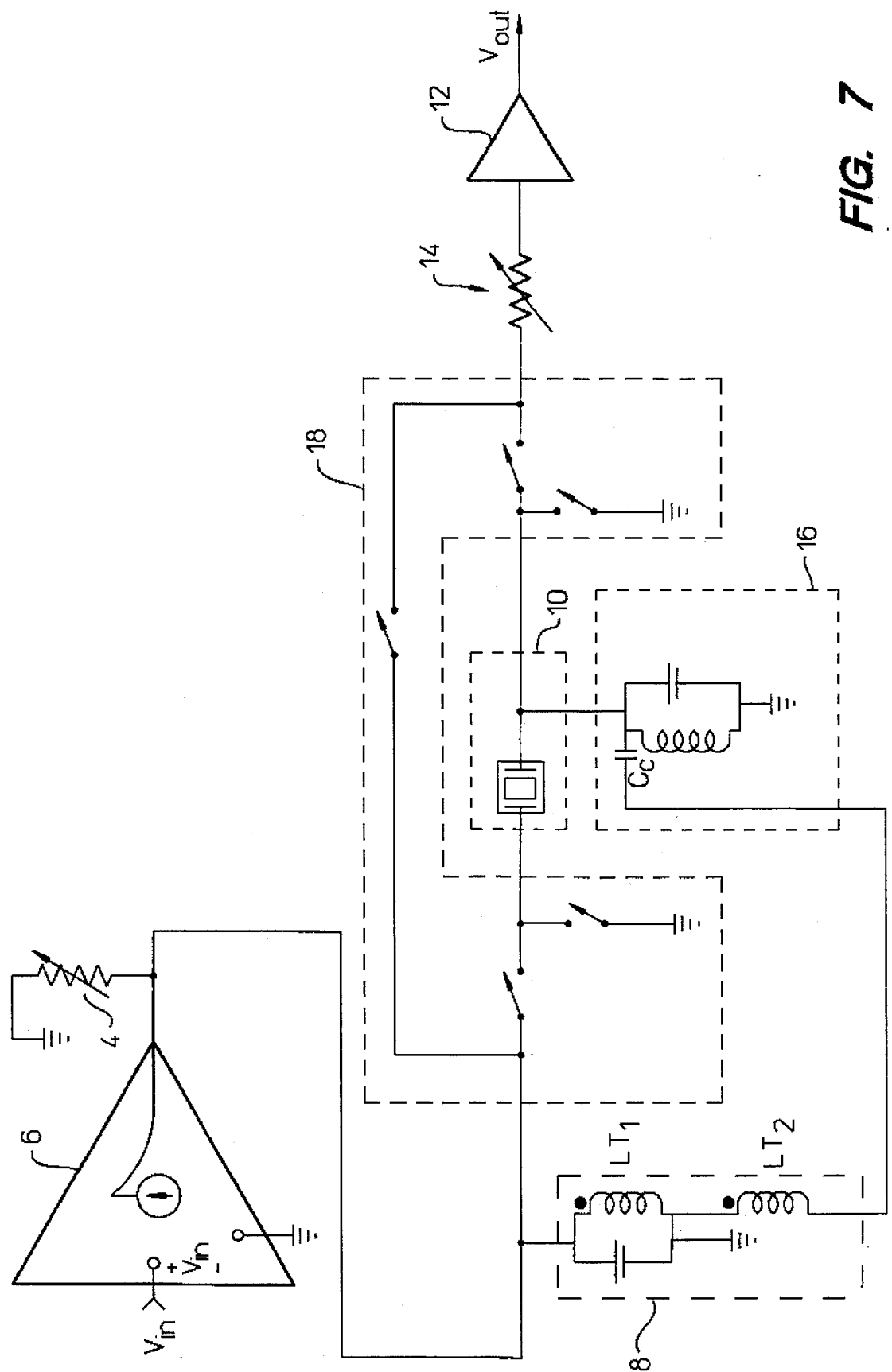
FIG. 7 illustrates a circuit implementation for the functional block diagram shown in FIG. 4.

FIG. 7 illustrates a circuit implementation for the functional block diagram shown in FIG. 4.

The parallel resonator 8 shown in FIG. 4 is built as a capacitor and inductor in parallel. The inductor of the parallel resonator 8 has an extra winding to neutralize the crystal case capacitance of the series resonator 10. The optional LC parallel resonator 16 further neutralizes the crystal case capacitance.

$L_{T1}$ and $L_{T2}$ form the inductor of the parallel resonator 8. $L_{T2}$ provides a current in $C_c$ that is equal and opposite to the current associated with the case capacitance of the series resonator 10. In this manner, the inductor of the first parallel resonator 8 provides a current which tunes out the capacitance of the series resonator 10.

I claim:

1. An intermediate frequency bandpass filter, comprising:

a high output impedance amplifier having a high impedance output;

a first resistive network, connecting between the high impedance output and ground;

a first parallel resonator connecting between the high impedance output and ground;

a series resonator, connecting to the high impedance output, having a resonator terminal;

a second resistive network having a first and a second end, the first end connecting to the resonator terminal;

a low input impedance amplifier, connecting to the second end, having a low impedance input; and a switch network connecting between the high impedance output and the first end of the second resistive network.

2. An intermediate frequency bandpass filter, as defined in claim 1, the first resistive network comprising a first variable resistance device connecting between the high impedance output and ground.

3. An intermediate frequency bandpass filter, as defined in claim 2, wherein the first variable resistance device is a PIN diode.

4. An intermediate frequency bandpass filter, as defined in claim 2, the first variable resistive device comprising:

a variable resistor connecting to the high impedance output; and a resistor connecting between the variable resistor and ground.

5. An intermediate frequency bandpass filter, as defined in claim 1, the second resistive network comprising a second variable resistor.

6. An intermediate frequency bandpass filter, as defined in claim 5, the second resistive network further comprising a capacitor connecting between the second variable resistor and the low impedance input.

7. An intermediate frequency bandpass filter, as defined in claim 1, further comprising a second parallel resonator connecting between the first end of the second resistive network and ground.

8. An intermediate frequency bandpass filter, comprising:

a high output impedance amplifier having a high impedance output;

a first resistive network, connecting between the high impedance output and ground;

a series resonator, connecting to the high impedance output, having a resonator terminal;

a second resistive network having a first and a second end, the first end connecting to the resonator terminal;

a low input impedance amplifier, connecting to the second end, having a low impedance input;

a switch network connecting between the high impedance output and the first end of the second resistive network; and a parallel resonator, connecting to between the first end of the second resistive network and ground.

9. An intermediate frequency bandpass filter, as defined in claim 8, the first resistive network comprising a first variable resistance device connecting between the high impedance output and ground.

10. An intermediate frequency bandpass filter, as defined in claim 9, wherein the first variable resistance device is a PIN diode.

11. An intermediate frequency bandpass filter, as defined in claim 9, the first variable resistive device comprising:

a variable resistor connecting to the high impedance output; and a resistor connecting between the variable resistor and ground.

12. An intermediate frequency bandpass filter, as defined in claim 8, the second resistive network comprising a second variable resistor.

13. An intermediate frequency bandpass filter, as defined in claim 12, the second resistive network further comprising a capacitor connecting between the second variable resistor and the low impedance input.

* * * * *